(12) United States Patent
Fehkuhrer

(10) Patent No.: US 10,049,902 B2
(45) Date of Patent: Aug. 14, 2018

(54) SUBSTRATE STACK HOLDER, CONTAINER AND METHOD FOR PARTING A SUBSTRATE STACK

(71) Applicant: EV GROUP E. THALLNER GMBH, St. Florian am Inn (AT)

(72) Inventor: Andreas Fehkuhrer, Senftenbach (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/526,363

(22) PCT Filed: Aug. 19, 2015

(86) PCT No.: PCT/EP2015/069082
§ 371 (c)(1),
(2) Date: May 12, 2017

(87) PCT Pub. No.: WO2016/087062
PCT Pub. Date: Jun. 9, 2016

(65) Prior Publication Data
US 2017/0316962 A1    Nov. 2, 2017

(30) Foreign Application Priority Data

Dec. 5, 2014   (DE) .......................... 10 2014 118 017

(51) Int. Cl.
*H01L 21/683*  (2006.01)
*H01L 21/762*  (2006.01)
(Continued)

(52) U.S. Cl.
CPC .. *H01L 21/67092* (2013.01); *H01L 21/67109* (2013.01); *H01L 21/67309* (2013.01);
(Continued)

(58) Field of Classification Search
CPC ......... H01L 21/67092; H01L 21/67109; H01L 21/67309; H01L 21/6732; H01L 21/6838;
(Continued)

(56) References Cited

U.S. PATENT DOCUMENTS 5,374,564 A   12/1994   Bruel .............................. 437/24
5,783,022 A   7/1998    Cha et al. ...................... 156/344
(Continued)

FOREIGN PATENT DOCUMENTS

| DE | 698 16 955 T2 | 6/2004 | ............... B26F 3/00 |
| EP | 0 867 917 A2 | 9/1998 | ............. H01L 21/00 |
| WO | 2014/037791 A1 | 3/2014 | ............. H01L 21/67 |

OTHER PUBLICATIONS

International Search Report from corresponding International Patent Application No. PCT/EP2015/069082, dated Oct. 20, 2015.

*Primary Examiner* — Stephen W Smoot
(74) *Attorney, Agent, or Firm* — Kusner & Jaffe

(57) ABSTRACT

A substrate stack holder, a container comprising a plurality of substrate stack holders, and a method for parting a substrate stack. The substrate stack holder includes (a) a holding and separating device for (i) holding a substrate stack during a parting process in which the substrate stack is split into a first substrate stack part and a second substrate stack part, said substrate stack comprised of a first substrate, a second substrate, and a connecting region therebetween, and (ii) separating the first substrate stack part from the second substrate stack part after the parting process; and (b) a fixing device for receiving and fixing the separated first and second substrate stack parts.

20 Claims, 5 Drawing Sheets

(51) Int. Cl.
   *H01L 21/67*      (2006.01)
   *H01L 21/687*     (2006.01)
   *H01L 21/673*     (2006.01)

(52) U.S. Cl.
   CPC .... *H01L 21/6838* (2013.01); *H01L 21/68735* (2013.01); *H01L 21/68771* (2013.01); *H01L 21/76254* (2013.01)

(58) Field of Classification Search
   CPC ......... H01L 21/68735; H01L 21/68771; H01L 21/76254; H01L 21/76259
   See application file for complete search history.

(56) References Cited

U.S. PATENT DOCUMENTS

| | | | |
|---|---|---|---|
| 5,897,743 | A | 4/1999 | Fujimoto et al. ............. 156/584 |
| 6,391,743 | B1* | 5/2002 | Iwane ............... H01L 21/67092 |
| | | | 136/243 |
| 6,436,226 | B1 | 8/2002 | Omi et al. .................... 156/344 |
| 2005/0000649 | A1 | 1/2005 | Rayssac et al. ............. 156/344 |
| 2013/0062020 | A1* | 3/2013 | Ries ................. H01L 21/67092 |
| | | | 156/715 |
| 2014/0020846 | A1 | 1/2014 | Hirakawa et al. ........... 156/711 |
| 2014/0144593 | A1 | 5/2014 | Dang et al. .................. 156/712 |
| 2015/0231790 | A1 | 8/2015 | Landru .................... B26D 3/28 |

* cited by examiner

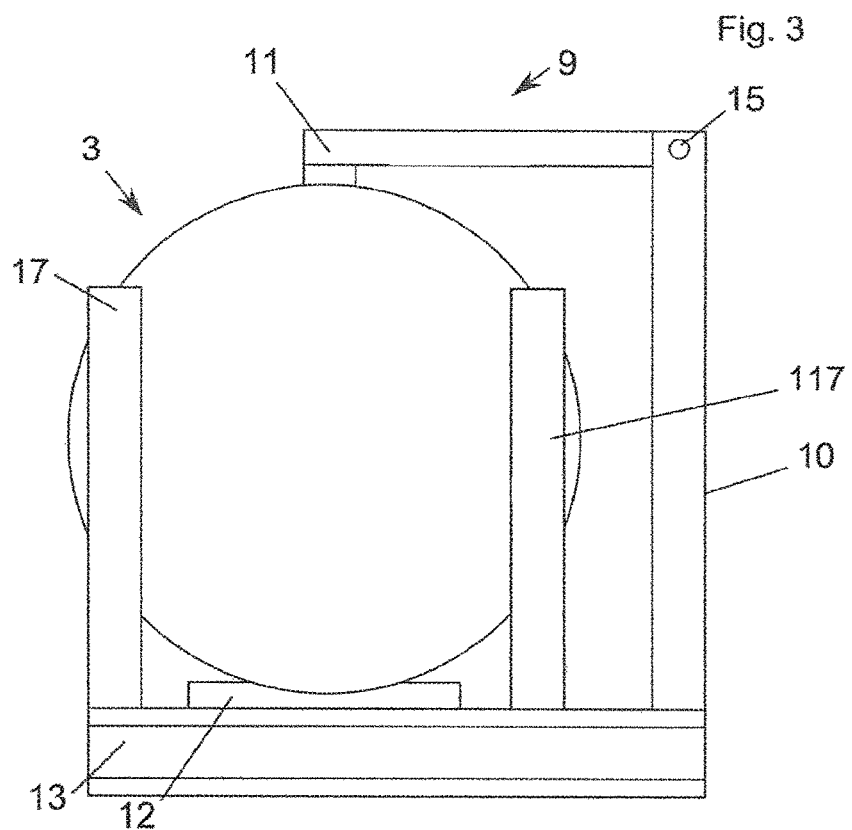
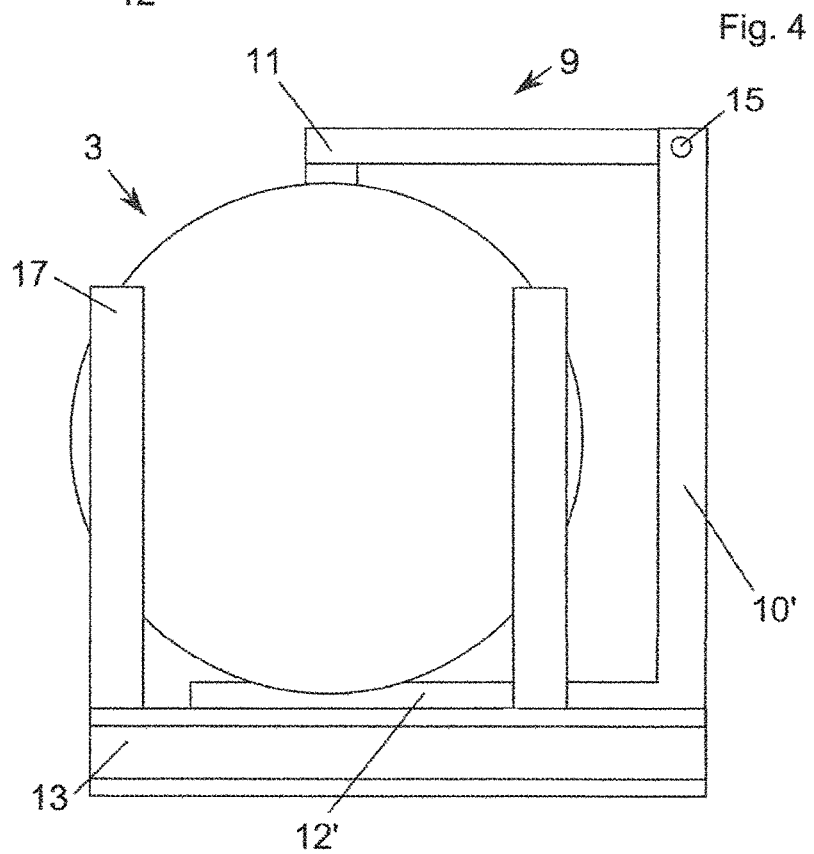

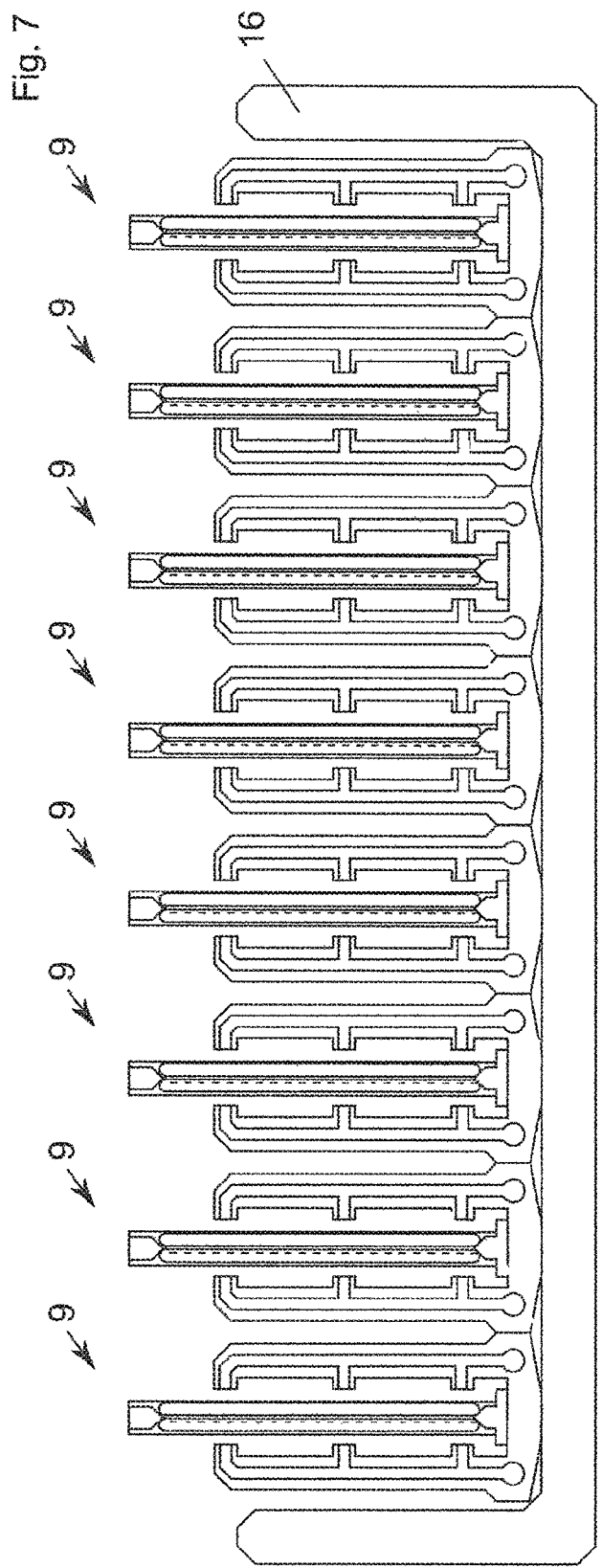

SUBSTRATE STACK HOLDER, CONTAINER AND METHOD FOR PARTING A SUBSTRATE STACK

FIELD OF THE INVENTION

The invention relates to a substrate stack holder, a container comprising such substrate stack holders and a method for parting a substrate stack.

BACKGROUND OF THE INVENTION

In the prior art, a so-called layer transfer process is preferably used for the production of SOI (silicon on insulator) wafers or structures.

In a first process step, an ion species which is formed into a gas at raised temperatures is introduced by an implantation process into a first semiconductor substrate. The oxidation of the first semiconductor substrate takes place in a further process step. The bonding of the oxide-coated first semiconductor substrate with a second substrate takes place in a further process step. A heat treatment of the produced substrate stack takes place after the bonding process. The heat treatment leads to a fracture along the first semiconductor substrate. After the fracture, the layer thus produced still adheres with its oxide layer to the second semiconductor substrate, whereas the main part of the first semiconductor substrate can be removed. This process is known in particular under the name smart cut process. The smart cut process is described in particular in publication U.S. Pat. No. 5,374,564A.

The recombination of the substrate stack parts parted from one another shortly before represents a frequently occurring problem in the prior art. The renewed parting of the two substrate stack parts from one another is relatively difficult and costly.

SUMMARY OF THE INVENTION

It is an objective of the present invention, therefore, to provide an improved substrate stack holder and an improved method for parting a substrate stack.

This problem is solved with the subject-matters of the independent claim(s). Advantageous developments of the invention are given in the sub-claims. All combinations of at least two features given in the description, the claims and/or the figures also fall within the scope of the invention. In stated value ranges, values lying inside the stated limits are also deemed to be disclosed as limiting values and can be claimed in any combination.

The idea according to the invention is to design a substrate stack holder for a substrate stack, which on the one hand assists, in particular mechanically, a parting process and on the other hand prevents the substrate stack parts from coming into contact with one another after the parting. Advantageously, an undesired subsequent joining of the substrate stack parts can thus be prevented. The substrate stack holder according to the invention comprises a holding and separating device and a fixing device. The holding and separating device is used for the positioning and fixing of the substrate stack before the parting process and is thus responsible for the preliminary fixing. Moreover, it is used for separating of the substrate stack parts after the parting process. The fixing device comprises elements for fixing the two substrate stack parts after the parting process in a separated position and is therefore responsible for the post-fixing.

In the following text, parting of the substrate stack should be understood to mean the splitting of the substrate stack into the substrate stack parts, in particular in the context of a layer transfer process, but is not limited thereto. Separating of the substrate stack parts should be understood to mean the movement of the substrate stack parts away from one another, so that the substrate stack parts can no longer come into contact after the parting of the substrate stack.

The Holding and Separating Device

In the following text, the holding and separating device will first be described as a first design feature according to the invention. It is to be designed in such a way that it is capable of holding a substrate stack in position until the actual parting process. Moreover, it is constituted such that it separates the substrate stack parts from one another after the parting process, so that the substrate stack parts do not come into contact. The substrate stack holder or the holding and separating device is preferably constituted for the vertical accommodation of the substrate stack. As a result of the vertical orientation, installation space can in the first place advantageously be saved and in the second place the unloading or loading of the substrate stack holder can be simplified. Alternatively, it is possible for the substrate stack to be accommodated in another orientation, in particular in the horizontal orientation.

In a preferred embodiment, the holding and separating device can comprise at least one clamping arm, in particular constituted wedge-shaped, which is constituted capable of firmly clamping the substrate stack radially from the exterior in the joining region. The wedge angle is in particular greater than 15°, preferably greater than 45°, still more preferably greater than 75°, most preferably greater than 105°, with utmost preference greater than 135°. Joining region is understood to mean the region that is arranged between the two substrates and by means of which the two substrates are joined together to form the substrate stack. The clamping arm can exert a force radially from the exterior on the substrate stack in the joining region (or in a weakening plane running beside and/or parallel to the joining region), so that the substrate stack can be held stably in its position. As a result of the wedge-shaped formation of the clamping arm, a particularly stable holding of the substrate stack can advantageously be achieved. Moreover, the wedge shape in combination with the clamping force assists the separation of the parted substrate stack parts from one another.

In a particularly preferred embodiment, the clamping arm comprises an articulated joint. The clamping arm can be folded over the substrate stack by means of the articulated joint and, in particular through its inherent weight, can fix the substrate stack and bring about the separation of the substrate stack parts. The clamping arm is placed under tension in particular by a spring or via another machine element, in such a way that a light pressure is exerted on the substrate stack. A motorised clamping arm would also be possible. Alternatively, a mechanical clamping arm as described above, in particular with a spring for the automatic return, can be incorporated, which is actuated in particular by a force effect of an external machine.

In another preferred embodiment, the clamping arm is made from an elastic material, in particular from plastic, preferably from metal, still more preferably from a carbon composite material, and is fixed not by way of an articulated joint, but rather by way of a fixed bearing. In a very particularly preferred embodiment, the clamping arm is produced from a ceramic, in particular silicon nitride ($Si_3N_4$). Such ceramics are relatively brittle, but on the other hand inert, and relatively insensitive to higher temperatures.

Since no particular high mechanical loads act on the clamping arm, such brittle ceramics can be used. As a result of the elasticity of the clamping arm material, the clamping arm can be raised at least several millimeters, so that the loading and/or unloading of the substrate stack is enabled. The fixing part of the clamping arm can rise by more than 0.1 mm, preferably by more than 1 mm, still more preferably by more than 10 mm. The modulus of elasticity of the material lies between 1 GPa and 1000 GPa, preferably between 10 GPa and 1000 GPa, more preferably between 100 GPa and 1000 GPa, most preferably between 500 GPa and 1000 GPa, with utmost preference between 800 GPa and 1000 GPa.

In a preferred embodiment, the holding and separating device comprises a pedestal, constituted in particular wedge-shaped, on which the substrate stack can be placed in its connecting region, in particular on edge. The pedestal preferably has a wedge angle greater than 15° C., preferably greater than 45°, still more preferably greater than 75°, most preferably greater than 105°, with utmost preference greater than 135°. The shape of a pedestal, which does not surround the substrate stack, improves the parting and distancing of the substrate stack parts in the direction of the fixing. This is because the two substrate stack parts, after their parting, are able to move in the direction of the fixing, since they are not completely surrounded at their underside.

As a result of the wedge-shaped formation of the pedestal, particularly stable holding of the substrate stack can also advantageously be achieved. Moreover, the wedge shape in combination with the force of gravity assists the separation of the parted substrate stack parts from one another. As a result of the edgewise arrangement of the substrate stack, a particularly efficient separation of the substrate stack parts from one another can advantageously take place.

The pedestal is preferably designed in such a way that it gives the substrate stack sufficient hold in the parted state, and at the same time permits a separation of the two substrate stack parts after the parting that is as easy as possible, in particular automatic due to the force of gravity.

The pedestal and the clamping arm can be designed and assembled separately from one another. It is also conceivable, however, for the clamping arm and the pedestal to represent two portions of a coherent component, in particular acting in an elastically clamping manner.

The embodiment according to the invention with a clamping arm and a pedestal is particularly well suited for vertically mounted substrate stack holders, since the substrate stack can be duly placed on the pedestal and fixed by means of the clamping arm. In another embodiment, it is possible to design a symmetrical holder, wherein the holding and separating device is constituted as a symmetrical fork, the two prongs whereof represent two symmetrical clamping arms. This fork is designed elastic, in such a way that the substrate stack can be fixed by light pressure in the fork and only falls away laterally from the latter by parting.

The holding and separating device can in particular be produced from one or more of the following materials:
ceramic, in particular
  nitride ceramic in particular,
    silicon nitride ($Si_3N_4$)
  carbide ceramic or
  inorganic non-metallic glasses, in particular
    non-oxidic glasses, or
    oxidic glasses, in particular
  silicate glasses or
  borate glasses or
  phosphate glasses
metal, in particular
  refractory metal, in particular,
    W, Nb, Ta, Ti, Zr, Hf, V, Cr, Mo
  higher-melting pure metals, in particular
    Cu, Al, Ni, Pt
  steel
alloys, in particular
  metal alloys
plastic, in particular
  thermosetting plastic The Fixing Device The fixing device is the second essential design feature of the substrate stack holder according to the invention.

The fixing device is designed in such a way that it surrounds the substrate stack and thus the substrate stack parts. The fixing device preferably comprises, on each side of the substrate stack, at least one framework support, arranged parallel to the substrate stack, with fixing elements for receiving and fixing the separated substrate stack parts, in order to fix the substrate stack parts to the framework supports after the parting. As a result of the immediate fixing, an undesired contacting of the substrate stack parts after their parting is prevented, the substrate stack parts remain parted from one another and can, especially after the end of a heat treatment process, be removed from the substrate stack holder.

In a preferred embodiment, the fixing elements are constituted as suction openings connected to vacuum lines for engaging the substrate stack parts by suction. As a result of the engagement by suction, damage to the substrate stack parts can advantageously be largely prevented. The suction openings are connected to, in particular two, vacuum lines independent of one another, which are incorporated in particular in the framework supports. Each of the vacuum lines can be controlled separately from the respective other vacuum line by means of a vacuum pump and/or suitable fluid elements. The separate control of the vacuum line permits the separate removal of the individual substrate stack parts. In particular embodiments, liquid-dynamic components can be connected upstream of the individual vacuum lines in such a way that a simultaneous evacuation of both vacuum lines and therefore a simultaneous suction effect on both substrate stack parts can take place.

A pressure of less than 1 bar, preferably less than 800 mbar, still more preferably less than 500 mbar, most preferably less than 200 mbar can be adjusted in each vacuum line. It is an important aspect according to the invention for the substrate stack parts to be loaded only very slightly following the parting according to the invention. Consequently, only pressures slightly below atmospheric pressure are preferably adjusted in the vacuum lines. If the embodiment according to the invention is to be used in an excess pressure environment, the pressure in the vacuum line is therefore in particular 200 mbar, more preferably 500 mbar, still more preferably 800 mbar less than the ambient pressure. The vacuum lines can subsequently also be subjected to excess pressure in order to release the substrate stack parts more efficiently from the fixing. This is expedient especially when the embodiment according to the invention is located in an excess pressure chamber, in which the pressure in the vacuum lines has to be greater than the chamber pressure of the excess pressure chamber. The vacuum lines can in this case withstand a pressure between 1 bar and 10 bar, preferably between 1 bar and 8 bar, still more preferably between 1 bar and 5 bar, most preferably between 1 bar and 3 bar, with utmost preference between 1 bar and 2 bar. The use of small sealing rings or contacts similar to a suction cup is conceivable, which connect to the suction openings in order to produce optimum contact between the substrate stack part and the vacuum line. Such sealing elements should in particular be elastic and/or vacuum-tight and/or possess a high temperature stability.

The modulus of elasticity of such seals is in particular less than 200 GPa, preferably less than 100 GPa, still more preferably less than 1 GPa, most preferably less than 100 MPa, with utmost preference less than 10 MPa. The tightness is in particular greater than 1 mbar*l/s, preferably between 2 and 10 mbar*l/s, still more preferably between 4 and 10 mbar*l/s, most preferably between 6 and 10 mbar*l/s, with utmost preference between 8 and 10 mbar*l/s. These tightness values are achieved by the materials used, in particular also at raised temperatures, so that a secure vacuum fixing is produced in every temperature range. In particular, the materials are temperature-stable up to over 100° C., still more preferably up to over 250° C., still more preferably up to over 500° C., most preferably up to over 750° C., with utmost preference up to over 1000° C.

In an alternative embodiment, the fixing device comprises electrostatic fixing elements. The electrostatic fixing elements in particular comprise electrically conductive components, in particular plates which has been electrically insulated from the framework supports. The electrically conductive components can be put at a well-defined potential by suitable supply lines. The electrically conductive components can if necessary be separable fully automatically from the electric circuit. The use of such electrostatic fixing elements presupposes substrate stack parts with suitable physical properties and a suitable behaviour with regard to electrostatics.

In the simplest embodiment, the electrically conductive components are small cylinders. Compared to their characteristic average diameter or average dimension, the cylinders have a correspondingly small thickness and can therefore also be referred to as discs. The base area of the cylinders is either a circular segment, a semicircular segment, a part-circular segment with an arbitrary segment angle, a rectangle, especially a square, or any other geometrical figure. The different geometrical figures have different characteristic dimensions. In the following text, the expression "dimension" will be used synonymous with the characteristic dimension ascribed in each case to the geometrical figure. Thus, for a circle this is understood to mean the diameter, for a rectangle the average value of its two sides etc. The dimension is in particular less than 10 cm, preferably less than 8 cm, more preferably less than 6 cm, most preferably less than 4 cm, with the utmost preference less than 2 cm.

The thickness of the cylinder is in particular less than 6 cm, preferably less than 4 cm, more preferably less than 2 cm, most preferably less than 1 cm, with the utmost preference less than 0.5 cm. In a very particularly preferred embodiment, two plates are always connected together as electrodes and lie at anti-pole potential. The substrate stack part to be influenced thus experiences a correspondingly anti-pole influence. The applied potential at such an electrode preferably lies between −30,000 V and 30,000 V, preferably between −20,000 V and 20,000 V, still more preferably between −10,000 V and 10,000 V, most preferably between −5000 V and 5000 V, with utmost preference between −3000 V and 3000 V.

In a particularly preferred embodiment, the electrodes are completely surrounded by an insulating material, so that no discharge to the surroundings can take place. In particular, dielectrics, preferably plastics, more preferably ceramics, come into consideration as an insulating material, which can withstand correspondingly high temperatures.

In a further preferred embodiment, switchable surfaces are present on the framework support. A switchable surface is understood, according to the invention, to mean a surface which can change its adhesion property, in particular its adhesiveness, as a result of a pulse, in particular an electrical signal. The adhesion is preferably defined by the energy of per unit area that is required for two surfaces that are joined together to be parted from one another. The energy is given in $J/m^2$. The energy per unit area, in the deactivated state of the switchable surface, i.e. in the state in which the adhesion should assume a minimum, is less than 2.5 $J/m^2$, preferably less than 0.1 $J/m^2$, more preferably less than 0.01 $J/m^2$, most preferably less than 0.001 $J/m^2$, with utmost preference less than 0.0001 $J/m^2$, most preferably of all less than 0.00001 $J/m^2$. The energy per unit area, in the activated state of the switchable surface, i.e. in the state in which the adhesion should assume a maximum, is greater than 0.00001 $J/m^2$, preferably greater than 0.0001 $J/m^2$, more preferably greater than 0.001 $J/m^2$, most preferably greater than 0.01 $J/m^2$, with utmost preference greater than 0.1 $J/m^2$, most preferably of all greater than 1 $J/m^2$.

In a further preferred embodiment, mechanical clamps are fixed to the framework support, which can be switched by means of mechanical and/or pneumatic and/or hydraulic control.

The fixing device and the framework support can be produced from one or more of the following materials:
ceramic, in particular
    nitride ceramic in particular,
        silicon nitride ($Si_3N_4$)
    carbide ceramic or
    inorganic non-metallic glasses, in particular
        non-oxidic glasses, or
        oxidic glasses, in particular
silicate glasses or
borate glasses or
phosphate glasses
metal, in particular
    refractory metal, in particular,
        W, Nb, Ta, Ti, Zr, Hf, V, Cr, Mo
    higher-melting pure metals, in particular
        Cu, Al, Ni, Pt
    steel
alloys, in particular
    metal alloys
plastic, in particular
    thermosetting plastic
Container A further subject-matter of the present invention according to another independent claim relates to a container, comprising a multiplicity of substrate stack holders according to one of the previously described embodiments and arranged in particular horizontally beside one another. All the features and examples of embodiment described above for the substrate stack holder are also deemed to apply analogously to the container according to the invention.

A plurality of substrate stack holders can be placed or arranged in a container. Containers made of ceramic, in particular glass, more preferably borosilicate glass, are in particular conceivable. The container can also be any kind of container that is suitable for accommodating the substrate stack holders. The container is preferably open, so that the substrate stack can be loaded and unloaded automatically.

The holders and fixings of the containers are made of heat-resistant material. According to the invention, therefore, it is made possible to carry out the parting in a furnace, in particular a continuous furnace, and to fix the two substrate stack parts parted from one another immediately by the fixing while still in the furnace and thus to keep them parted from one another. A renewed adhesion of the two substrate stack parts by contacting does not therefore arise.

The container can be produced from one or more of the following materials:
ceramic, in particular
   nitride ceramic in particular,
      silicon nitride ($Si_3N_4$)
   carbide ceramic or
   inorganic non-metallic glasses, in particular
      non-oxidic glasses, or
      oxidic glasses, in particular
   silicate glasses or
   borate glasses or
   phosphate glasses
metal, in particular
   refractory metal, in particular,
      W, Nb, Ta, Ti, Zr, Hf, V, Cr, Mo
   higher-melting pure metals, in particular
      Cu, Al, Ni, Pt
   steel
alloys, in particular
   metal alloys
plastic, in particular
   thermosetting plastic The Method A further subject-matter of the present invention according to an independent claim relates to a method for parting a substrate stack, in particular a layer transfer stack. All the features and examples of embodiment described above for the substrate stack holder and the container are also deemed to apply analogously to the method according to the invention and vice versa.

The method according to the invention comprises the loading, parting, fixing and unloading of a substrate stack, in particular a layer transfer stack, in a preferred embodiment a layer transfer stack, or substrate stack parts. In the following text, a layer transfer stack is intended to be used as an example of the process according to the invention. The selection of a layer transfer stack, however, is on no account limiting for the process according to the invention.

In a first process step according to the invention, the substrate stack is loaded into a substrate stack holder and held in the substrate stack holder, wherein it is in particular a substrate stack holder according to the above embodiments. In this regard, reference is made to the above comments. The loading takes place either manually or using a semiautomatic or fully automatic system. In high-volume production, the loading takes place in particular by means of a robot. In an exemplary embodiment, the substrate stack is positioned on a pedestal as described above. In particular, a clamping arm as described above can fix the substrate stack, preferably at least partially, more preferably predominantly, still more preferably solely by reason of its inherent weight and/or its prestressing.

In a preferred embodiment, the substrate stack is clamped or held between two prongs of an elastically constituted fork.

The robot thus preferably works only against the elastic resistance of the fork and clamps the substrate stack between the two prongs of the fork. The other sides of the fork prongs are preferably constituted wedge-shaped. A preferred process flow results from this preferred embodiment, since the triggering of a clamping arm rotatable about an articulated joint can be dispensed with. Shortened and therefore optimised process times thus result. Such a process step according to the invention for loading a substrate stack holder is in particular carried out repeatedly. The corresponding substrate stack holders are preferably placed in a row one behind the other, still more preferably housed in a container, so that in a subsequent process step they can be transported into a furnace, in particular a continuous furnace.

In a second process step according to the invention, the substrate stack holder with the substrate stack undergoes a heat treatment. The heat treatment preferably takes place in a furnace, preferably in a continuous furnace. The substrate stack is heated to a temperature greater than 25° C., preferably greater than 100° C., still more preferably greater than 250° C., most preferably greater than 500° C., with utmost preference greater than 750° C. The parts of the substrate stack holder are produced from materials that suffer no damage at correspondingly high temperatures, in particular from the materials described above. Use is preferably made of ceramics, in particular glass ceramics, silicon nitride, silicon carbide etc. Such materials have a relatively poor thermal conductivity, so that the substrate stack can be thermally insulated with regard to thermal conduction by the holder during the heat treatment process.

In order to achieve suitable thorough heating of the substrate stack, the space in which the process according to the invention takes place is in particular swept with a gas, in particular a gas with a suitably high thermal conductivity. The thermal conductivity of the gas is greater than zero 0 W/(m*K), preferably greater than 0.01 W/(m*K), still more preferably greater than 0.1 W/(m*K), most preferably greater than 1 W/(m*K). The thermal conductivity of helium lies approximately between 0.15 W/(m*K) and 0.16 W/(m*K). In the second process step according to the invention, the parting of the substrate stack into the two substrate stack parts takes place. The thorough heating can however also take place in a vacuum environment. The substrate stack is then heated preferably by infrared radiators or the heat is introduced by thermal convection by way of the holding and separating device.

In a third process step according to the invention, the substrate stack parts fall apart from one another. The separating process is brought about or at least assisted especially by a suitably shaped pedestal and/or a suitably shaped clamping arm. In particular, wedge-shaped pedestals and clamping arms contribute to the improved separation of the two substrate stack parts. In a preferred embodiment, the substrate stack parts come into the vicinity of the framework supports, in and/or on which the fixing elements are located. The fixing elements fix the substrate stack parts and prevent a recombination of the extremely reactive, clean and highly adhesive surfaces that have arisen as a result of the parting process. The parting of the substrate stack parts is thus maintained beyond the heat treatment process.

In a fourth process step according to the invention, the unloading of the substrate stack parts held apart from one another takes place. The unloading once again preferably takes place by means of a robot, i.e. fully automatically. Alternatively, manual or semiautomatic unloading is also conceivable.

A further subject-matter of the present invention relates to a use of a substrate stack holder according to one of the embodiments described above for parting a substrate stack, in particular according to a process according to the invention described above. Reference is made to the above comments to avoid repetition.

Further advantages, features and details of the invention emerge from the following description of preferred examples of embodiment and with the aid of the drawings.

BRIEF DESCRIPTION OF THE DRAWINGS

FIG. 3 shows a side view of a substrate stack holder according to an exemplary embodiment, FIG. 4 shows a side view of a substrate stack holder according to another exemplary embodiment, FIG. 6 shows a side view of a substrate stack holder according to another exemplary embodiment and FIG. 7 shows a cross-section of a side view of an embodiment of a container according to the invention.

Advantages and features of the invention are marked in the figures with reference numbers identifying the latter in each case according to the embodiments of the invention, wherein components and features with the same and/or an identically acting function can be marked with identical reference numbers.

DETAILED DESCRIPTION OF THE INVENTION

Figure 1A:
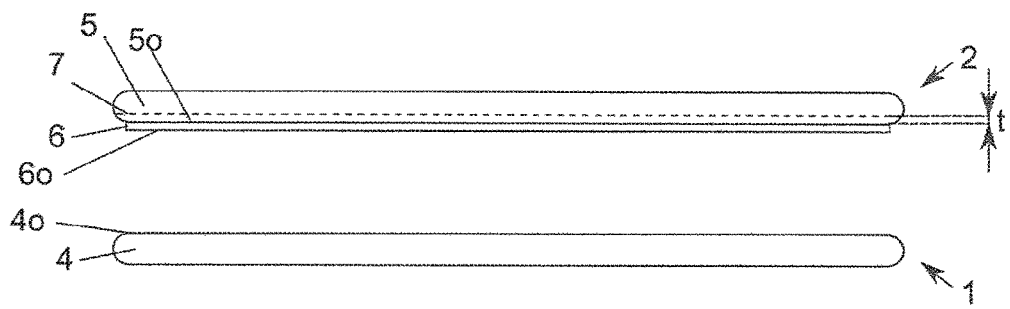
FIG. 1a, FIG. 1b and FIG. 1c show various steps in a process for producing and parting a layer transfer stack.
Figure 1B:
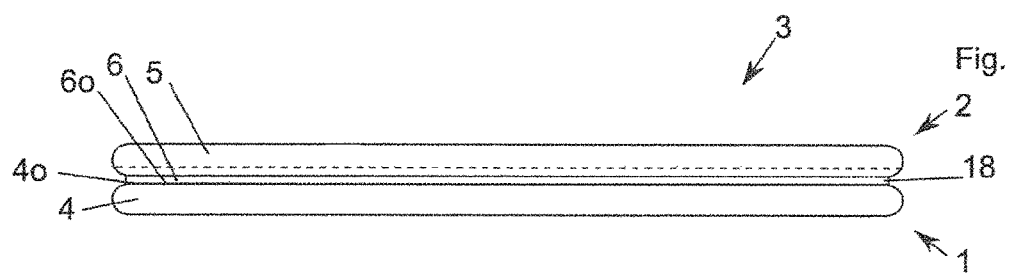
Figure 1C:
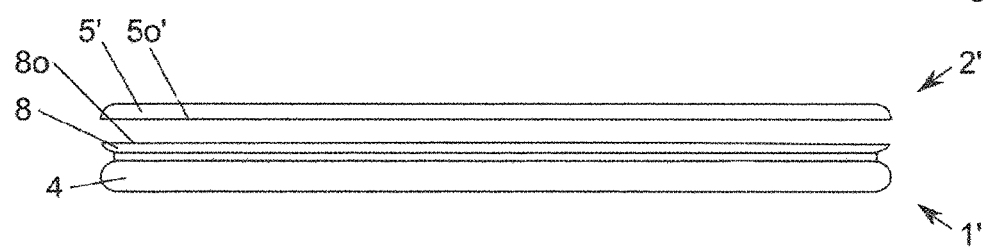

FIG. 1a, FIG. 1b and FIG. 1c show diagrammatically successive steps of a process for producing and parting a layer transfer stack 3.

The oxidation of a semiconductor substrate 2 takes place in a first process. Generated oxide layer 6 can then also be ground and thinned down in further process steps. In particular, a reduction of the roughness of oxide surface 6o takes place by means of such processes, this being necessary for the subsequent fusion bonding process. Oxide layer 6 can be thinned down by such process steps to thicknesses of a few microns, in particular a few nanometers.

In a further process step for the production of layer transfer stack 3, an ion species which is formed into a gas at raised temperatures is introduced by an implantation process into semiconductor substrate 2. The parameters of the implantation process can be adjusted such that average penetration depth t of the ion species can be determined very precisely. The ion species is in particular hydrogen ions. The hydrogen ions are then present at a well-defined depth of semiconductor substrate 2. Hydrogen ions have a relatively low mass and therefore, with moderate acceleration, can thus penetrate into semiconductor substrate 2 with a very low kinetic energy, without destroying the mono-crystalline microstructure of said semiconductor substrate. The hydrogen ions, especially at room temperature, are bound to the silicon lattice.

FIG. 1a shows a first substrate 1, made of a material, in particular semiconductor material 4, with a surface 4o, as well as a second substrate 2 with a semiconductor material 5, said second substrate being coated with an oxide layer 6. There have been implanted in second substrate 2, before the oxidation of its surface 5o with oxide layer 6, ions, such as hydrogen ions for example, at a depth t, along a weakening plane 7 using the implantation process described above.

In a further process step for producing substrate stack 3, the bonding of oxide-coated semiconductor substrate 2 with substrate 1 takes place. The bonding process can be a direct or fusion bond known from the prior art.

FIG. 1b shows a substrate sack 3, which has been produced by bonding the two substrates 1 and 2 via surface 6o of oxide layer 6 and surface 4o of material 4. The two substrates 1 and 2 are joined together in a joining region 18, which lies between the two substrates 1 and 2.

After the bonding process, a heat treatment takes place for the parting of produced substrate stack 3. The substrate stack holder according to the invention and/or the method according to the invention could be used in the course of such a heat treatment.

In this heat treatment, the hydrogen atoms bound to the lattice up to this point combine to form hydrogen gas. The hydrogen gas has a greater molecular volume than the hydrogen atoms bound to the lattice of the semiconductor substrate. The molar volume of the hydrogen gas is however also greater than the molar volume of the lattice vacancies occurring in the semiconductor substrate. The heat treatment therefore leads to a fracture along weakening plane 7 of semiconductor substrate 2. After the fracture, layer 8 thus produced adheres to oxide layer 6 on semiconductor substrate 1, while the other part of semiconductor substrate 2 can be removed.

FIG. 1c shows two newly formed substrate stack parts 1' and 2' after their parting from one another along weakening plane 7. Layer 8 with layer surface 8o has been removed along weakening plane 7 from semiconductor material 5' of substrate 2 with surface 5o'. SOI substrate stack part 1' arises as a result of the bond of layer 8 with semiconductor substrate 4 via oxide 6, while newly formed substrate stack part 2', reduced in size by the removal of layer 8, is left over as a residual substrate. In subsequent process steps, substrate stack part 2' can be provided with a further weakening plane again by ion implantation, then oxidised and reused.

Figure 2A:
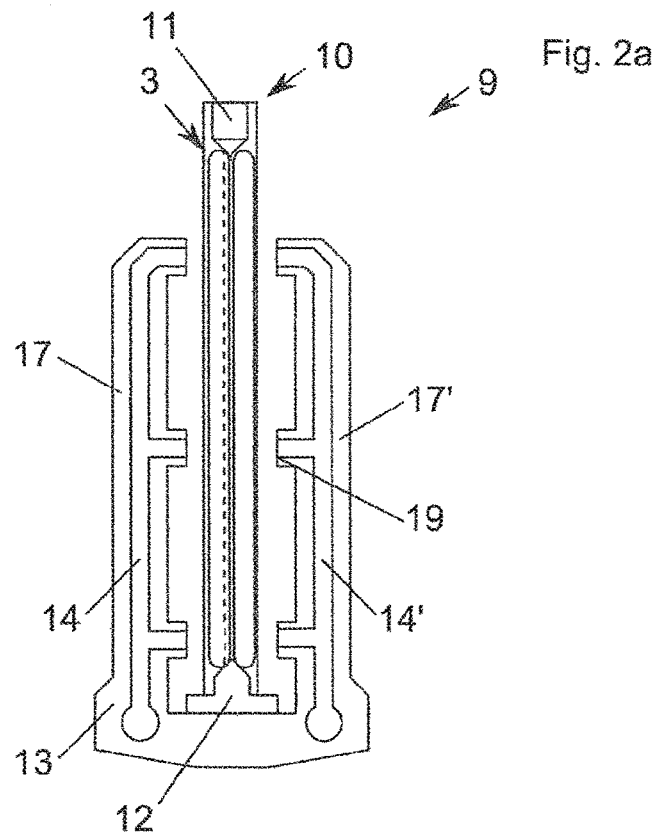
FIG. 2a shows a cross-section through a front view of an exemplary substrate stack holder with a substrate stack.

FIG. 2a shows the front view of a cross-section of an embodiment according to the invention of a substrate stack holder 9 with a substrate stack 3, in particular as shown in FIG. 1b, while substrate stack holder 9 fixes the substrate stack 3 which is not yet parted. The situation can occur for example before the heat treatment for the parting of substrate stack 3.

Substrate stack holder 9 comprises a horizontally arranged framework 13, on which a pedestal 12 is arranged firmly connected. Pedestal 12 is constituted wedge-shaped at the point on which substrate stack 3 sits. Substrate stack holder 9 further comprises two framework arms 17, 17' which extend in the vertical direction. The two framework arms 17, 17' are arranged parallel with one another and between them form a receiving space for substrate stack 3. Substrate stack 3 is arranged vertically in the receiving space between framework arms 17, 17' and stands on edge with its connecting region 18 on wedge-shaped pedestal 12. Framework arms 17, 17' extend on both sides of substrate stack 3 and are spaced apart from the surface of substrate stack 3. Framework arms 17, 17' each comprise fixing elements, in particular suction openings 19, which are connected to vacuum lines 14, 14' which in particular are switchable independently of one another. Substrate stack holder 9 further comprises a wedge-shape constituted clamping arm 11, which fixes and firmly clamps substrate stack 3 at its upper side in connecting region 18 of substrate stack 3.

Figure 2B:
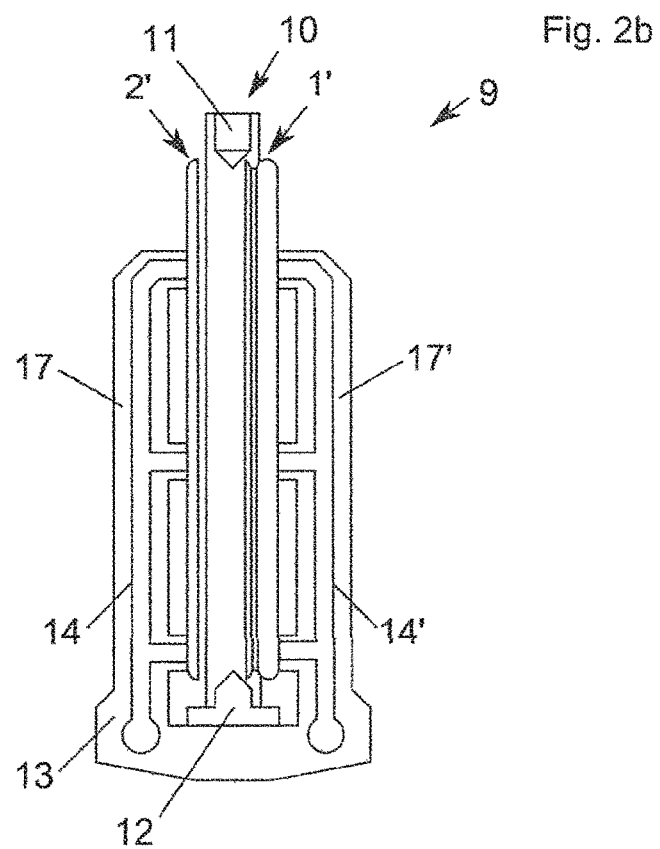
FIG. 2b shows a cross-section through a front view of the substrate stack holder according to FIG. 2a with parted substrate stack parts.

FIG. 2b shows diagrammatically substrate stack holder 9 from FIG. 2a, wherein substrate stack 3 has been parted by a heat treatment along its weakening plane 7 (represented with a dashed line in FIG. 2a) into the two substrate stack parts 1', 2'. FIG. 2b shows in particular a situation which, in chronological terms, occurs after the situation from FIG. 2a. Substrate stack parts 1', 2' have been separated from one another and lie against the fixing elements, in particular suction openings 19, of framework arms 17, 17', wherein they are engaged by suction via vacuum tracks 14, 14'. The separation is brought about by the wedge-shaped formation of clamping arm 11 and pedestal 12, wherein clamping arm 11 pushes the two substrate stack parts 1', 2' apart from one another by its clamping force acting radially inwards and downwards. Substrate stack parts 1', 2' are engaged by suction by means of suction openings 19 or vacuum lines 14, 14' and are fixed in the region of suction openings 19 to framework arms 17, 17'. Once substrate stack parts 1', 2' have been fixed by framework arms 17, 17', they can be removed from substrate stack holder 9 in a following step.

FIG. 3 shows a side view of another embodiment according to the invention of a substrate stack holder 9. In this embodiment, substrate stack holder 9 comprises two framework arms 17, 117 on each side of substrate stack 3. In respect of substrate stack 3, the one framework arm 17 is arranged in the front region of substrate stack 3 and the other framework arm 117 is arranged in the rear region of substrate stack 3. In this embodiment, clamping arm 11 is connected via an articulated joint 15 to a vertically arranged holding rod 10. Clamping arm 11 can thus be folded upwards for the loading of substrate stack 3 into substrate stack holder 9 and back downwards after the loading of substrate stack 3, so that clamping arm 11, especially through its inherent weight, can firmly clamp substrate stack 3 in its connecting region 18. In this clamping position, clamping arm 11 is arranged in particular horizontal. Moreover, substrate stack holder 9 comprises a pedestal 12 arranged horizontal on framework 13, which pedestal lies opposite clamping arm 11 and fixes substrate stack 3 in its connecting region 18 from beneath. In this embodiment, pedestal 12 is constituted as an independent component and is not connected to holding rod 10. As for the rest, reference is made to the embodiments in respect of FIGS. 2a and 2b.

FIG. 4 shows a side view of another embodiment according to the invention of substrate stack holder 9. This embodiment essentially corresponds to the embodiment from FIG. 3. In contrast with FIG. 3, pedestal 12' is connected in one piece with holding rod 10' in FIG. 4, wherein pedestal 12' and holding rod 10' form a right angle. In this embodiment, the fixing of holding rod 10' to framework 13 can advantageously be improved. As for the rest, reference is made to the embodiments in respect of FIG. 3.

Figure 5:
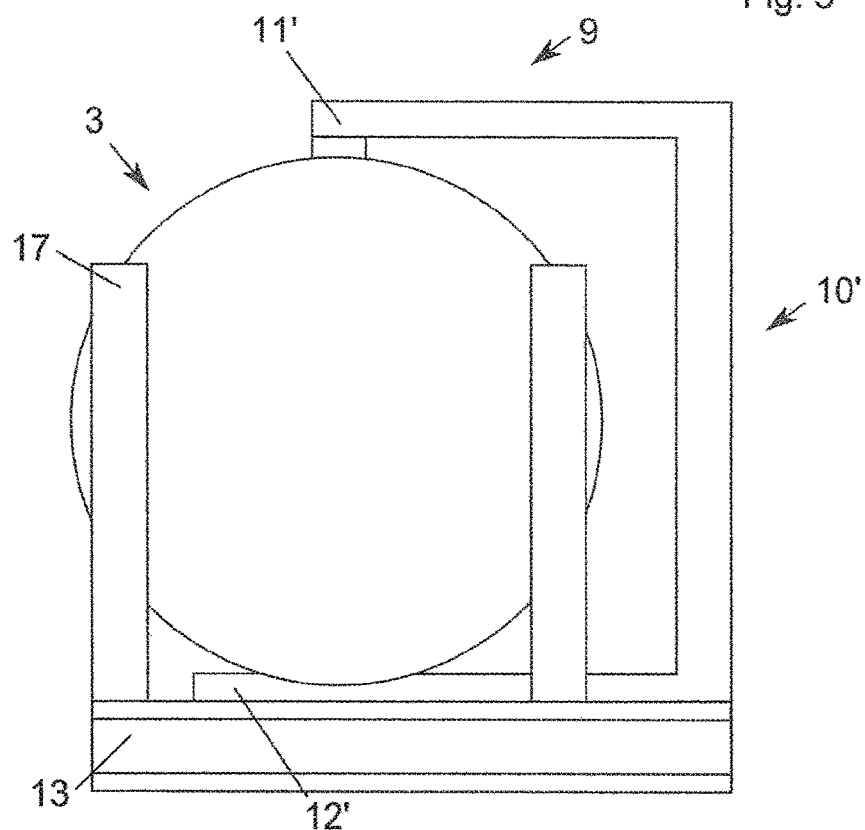
FIG. 5 shows a side view of a substrate stack holder according to another exemplary embodiment.

FIG. 5 shows another embodiment according to the invention of substrate stack holder 9, in which pedestal 12, holding rod 10' and clamping arm 11' are produced in one piece from a single component. Clamping arm 11' is no longer deflected out of its rest position by an articulated joint 15, but rather by its elasticity. For the loading, substrate stack 3 is guided between pedestal 12 and clamping arm 11', wherein clamping arm 11' can be pressed upwards on account of its elasticity. Substrate stack 3 is firmly clamped by clamping arm 11' as a result of this clamping force. This embodiment enables a comparatively simple loading of substrate stack 3 into substrate stack holder 9. As for the rest, substrate stack holder 9 is constructed as in FIG. 4, so that reference can be made to the above comments.

Figure 6:
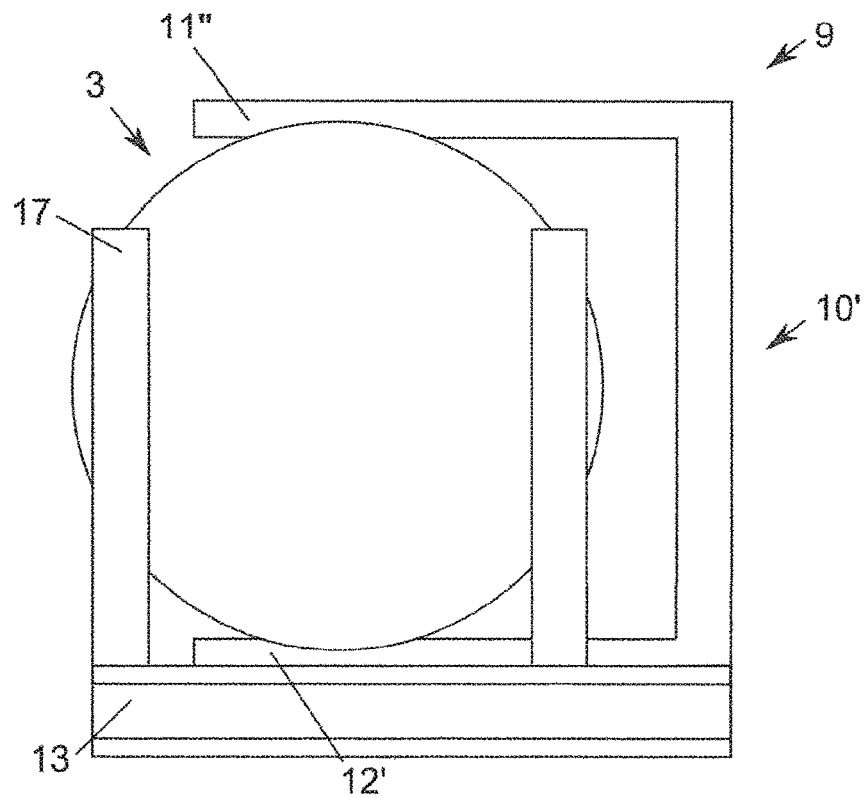

FIG. 6 shows another embodiment according to the invention of a substrate stack holder 9, in which pedestal 12, holding rod 10' and clamping arm 11" have been produced from a single component and form a U-shaped component, wherein the opening of the U points in the horizontal direction. In contrast with FIG. 5, clamping arm 11" is constituted here in the same way as pedestal 12'. This embodiment according to the invention is particularly well suited for the mounting of substrate stack holder 9 in a horizontal and/or vertical position. Holding rod 10' with pedestal 12' and clamping arm 11" represent an elastic fork with two prongs 11" and 12', which fix substrate stack 3 by means of a corresponding elastic pretensioning, as already described in FIG. 5 for clamping arm 11'.

FIG. 7 shows a container 16 according to the invention, which accommodates a plurality of substrate stack holders 9, in order for example to enable their transport. Suitable connecting elements, with the aid of which vacuum lines 14, 14' can be controlled, are not shown. In order to create a connection between vacuum lines 14, 14' and container 16, substrate stack holders 9 comprise corresponding interfaces or adaptors. For the sake of clarity, the latter have not been shown. The control of vacuum lines 14, 14' of substrate stack holders 9 can take place either individually or jointly. Container 16 can in particular be a special adapted wafer box.

LIST OF REFERENCE NUMBERS 1 substrate
1' first substrate stack part
2 substrate
2' second substrate stack part
3 substrate stack
4 semiconductor material
4o substrate surface
5, 5' semiconductor material
5o, 5o' substrate surface
6 oxide layer
6o oxide layer surface
7 weakening plane
8 layer
8o layer surface
9 substrate stack holder
10, 10' holding rod
11, 11', 11" clamping arm
12, 12' pedestal
13 framework
14, 14' vacuum lines
15 articulated joint
16 container
17, 17', 117 framework arms
18 connecting region
19 suction openings
t penetration depth Having described the invention, the following is claimed:

1. A substrate stack holder, comprising:
a holding and separating device for
holding a substrate stack during a parting process in which the substrate stack is split into a first substrate stack part and a second substrate stack part, wherein said substrate stack is comprised of a first substrate, a second substrate, and a connecting region therebetween, and
separating the first substrate stack part from the second substrate stack part after the parting process; and
a fixing device for receiving and fixing the separated first and second substrate stack parts, wherein the fixing device only engages with the first and second substrate parts after the first substrate part is separated from the second substrate part by the holding and separating device.

2. The substrate stack holder according to claim 1, wherein the holding and separating device comprises at least one clamping arm for clamping the substrate stack radially from the exterior at the connecting region of the substrate stack.

3. The substrate stack holder according to claim 2, wherein the at least one clamping arm has a wedge angle greater than 15°.

4. The substrate stack holder according to claim 2, wherein the at least one clamping arm is wedge-shaped.

5. The substrate stack holder according to claim 1, wherein the holding and separating device comprises a pedestal that receives the substrate stack at the connecting region.

6. The substrate stack holder according to claim 5, wherein the pedestal is wedge-shaped.

7. The substrate stack holder according to claim 5, wherein the pedestal receives the substrate stack at an edge of the connecting region.

8. The substrate stack holder according to claim 5, wherein the pedestal has a wedge angle greater than 15°.

9. The substrate stack holder according to claim 1, wherein the fixing device comprises at least one pair of framework supports, each framework support having at least one fixing element, wherein the first and second substrate stack parts are located between said at least one pair of framework supports.

10. The substrate stack holder according to claim 9, wherein each fixing element includes a suction opening that is connected to a vacuum to apply suction.

11. The substrate holder according to claim 9, wherein said at least one pair of framework supports includes a first framework support for receiving and fixing said first substrate stack part and a second framework support for receiving and fixing said second substrate stack part.

12. The substrate holder according to claim 9, wherein said at least one pair of framework supports are arranged parallel to the first and second substrate stack parts.

13. The substrate holder according to claim 9, wherein said at least one pair of framework supports are spaced from the first and second substrate stack parts during the parting process and the separating of the first substrate stack from the second substrate stack.

14. The substrate stack holder according to claim 1, wherein the substrate stack holder is adapted for vertical accommodation of the substrate stack.

15. A container, comprising:
a plurality of substrate stack holders arranged horizontally beside one another, wherein each substrate stack holder comprises:
a holding and separating device for holding a substrate stack during a parting process in which the substrate stack is split into a first substrate stack part and a second substrate stack part, wherein said substrate stack is comprised of a first substrate, a second substrate, and a connecting region therebetween, and separating the first substrate stack part from the second substrate stack part after the parting process; and
a fixing device for receiving and fixing the separated first and second substrate stack parts, wherein the fixing device only engages with the first and second substrate parts after the first substrate part is separated from the second substrate part by the holding and separating device.

16. A method for parting a substrate stack, comprising:
a) loading of the substrate stack into a substrate stack holder and holding of the substrate stack in the substrate stack holder,
b) heat treatment of the substrate stack for parting of the substrate stack into two substrate stack parts along a weakening plane,
c) separating of the substrate stack parts from one another,
d) receiving and fixing of the substrate stack parts parted from one another by a fixing device of the substrate stack holder, and
e) unloading of the parted substrate stack parts from the substrate stack holder.

17. The method according to claim 16, wherein in step b) the heat treatment takes place in a furnace, wherein the substrate stack is heated to a temperature greater than 25° C.

18. The method according to claim 17, wherein in step b) the furnace is swept with a gas, wherein thermal conductivity of the gas is greater than 0.01 W/(m*K).

19. The method according to claim 16, wherein in step d) the substrate stack parts are engaged by suction by means of vacuum lines arranged in the fixing device.

20. The method according to claim 16, wherein the substrate stack is arranged vertically in the substrate stack holder.

* * * * *